US 8,581,389 B2

(12) United States Patent
Chen et al.

(10) Patent No.: US 8,581,389 B2
(45) Date of Patent: Nov. 12, 2013

(54) UNIFORMITY CONTROL FOR IC PASSIVATION STRUCTURE

(75) Inventors: Hsien-Wei Chen, Sinying (TW); Tsung-Yuan Yu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 244 days.

(21) Appl. No.: 13/117,641

(22) Filed: May 27, 2011

(65) Prior Publication Data

US 2012/0299167 A1 Nov. 29, 2012

(51) Int. Cl.
*H01L 23/12* (2006.01)
*H01L 21/4763* (2006.01)
(52) U.S. Cl.
USPC .......... 257/700; 257/758; 257/774; 257/786; 257/E23.011; 257/E23.021; 257/E23.145; 257/E23.169; 257/E21.577; 438/622
(58) Field of Classification Search
None
See application file for complete search history.

(56) References Cited

U.S. PATENT DOCUMENTS

| | | | |
|---|---|---|---|
| 7,026,233 B2 | 4/2006 | Cheng et al. | |
| 7,233,052 B2 | 6/2007 | Tamaoka et al. | |
| 7,242,095 B2 | 7/2007 | Tabara et al. | |
| 7,696,607 B2 | 4/2010 | Sano et al. | |
| 2003/0222286 A1 | 12/2003 | Higuchi | |
| 2009/0206490 A1* | 8/2009 | Koide et al. | 257/774 |
| 2010/0213612 A1 | 8/2010 | Tseng et al. | |
| 2011/0001236 A1 | 1/2011 | Koide et al. | |
| 2011/0079922 A1* | 4/2011 | Yu et al. | 257/776 |
| 2011/0115073 A1* | 5/2011 | Chen | 257/737 |
| 2011/0248404 A1* | 10/2011 | Chiu et al. | 257/773 |

* cited by examiner

*Primary Examiner* — Alonzo Chambliss
(74) *Attorney, Agent, or Firm* — Haynes and Boone, LLP

(57) ABSTRACT

The present disclosure involves a semiconductor device. The semiconductor device includes a wafer containing an interconnect structure. The interconnect structure includes a plurality of vias and interconnect lines. The semiconductor device includes a first conductive pad disposed over the interconnect structure. The first conductive pad is electrically coupled to the interconnect structure. The semiconductor device includes a plurality of second conductive pads disposed over the interconnect structure. The semiconductor device includes a passivation layer disposed over and at least partially sealing the first and second conductive pads. The semiconductor device includes a conductive terminal that is electrically coupled to the first conductive pad but is not electrically coupled to the second conductive pads.

20 Claims, 8 Drawing Sheets

Fig. 1 — Prior Art

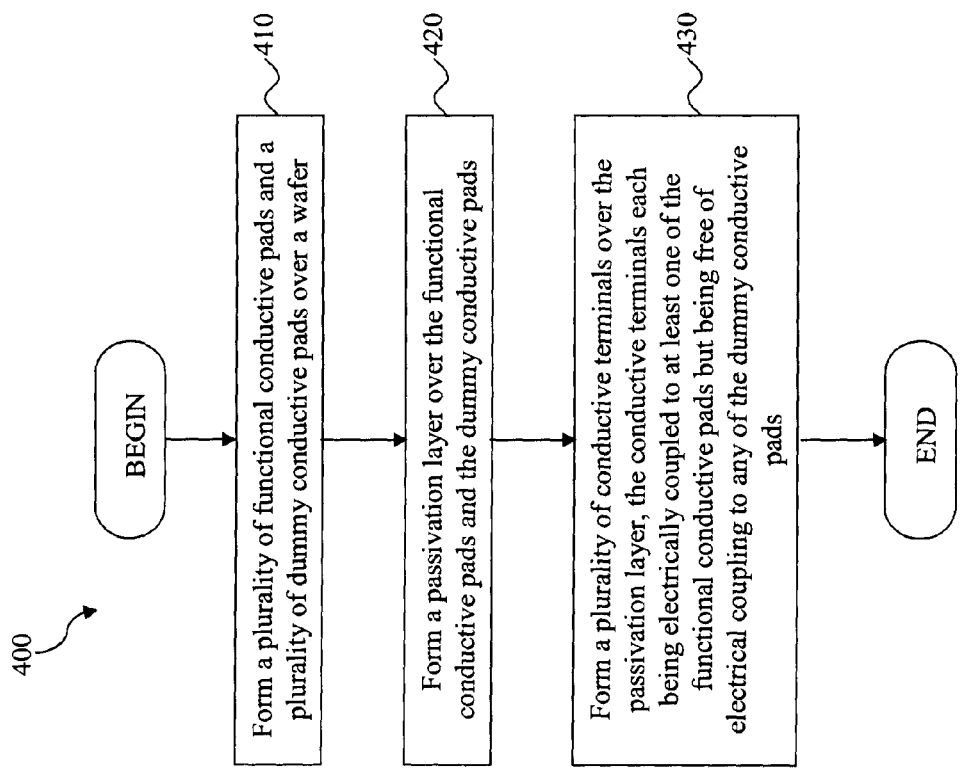

UNIFORMITY CONTROL FOR IC PASSIVATION STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The fabrication of IC devices typically involves a passivation process, in which a passivation structure is formed to protect the electronic components inside the IC devices from moisture, dust, and other contaminant particles. Post passivation interconnect (PPI) devices may be used to establish electrical connections between these electronic components inside the IC device and external devices. However, conventional IC devices often have poor PPI distribution uniformity. In other words, the PPI devices may have a high population density in some areas of an IC device while having a low population density in other areas of the IC device. The lack of PPI uniformity may adversely affect electrical performance and packaging reliability of the IC device.

Therefore, while existing IC passivation structures are generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 8 is a flowchart illustrating a method of forming a semiconductor device according to various aspects of the present disclosure.

DETAILED DESCRIPTION

Figure 1:
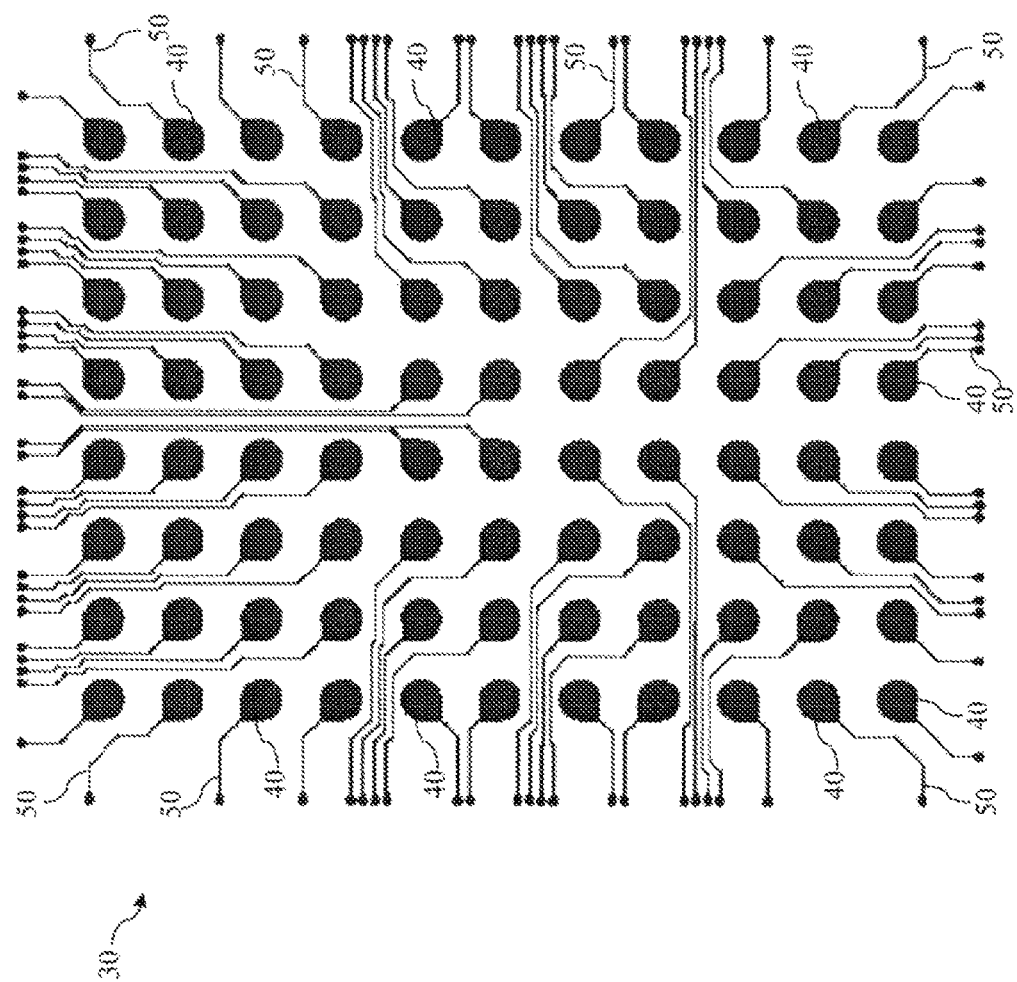
FIG. 1 is a simplified fragmentary top view of a portion of a conventional IC device.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified fragmentary top view of a portion of a conventional IC device 30. The IC device 30 includes a plurality of conductive pads 40. These conductive pads 40 are each coupled to one or more electronic components of the IC device 30. The conductive pads 40 are also coupled to conductive terminals (not illustrated herein) through a plurality of post passivation interconnect (PPI) lines 50. The PPI lines 50 and the conductive pads 40 may be formed in different layers, which is not necessarily discernable in FIG. 1, since FIG. 1 illustrates a top view.

As can be seen from FIG. 1, the distribution density of the conductive pads 40 and the PPI lines 50 are not uniform. For example, the distribution density of the PPI lines 50 near the edge regions of the IC device 30 may be greater than the distribution density of the PPI lines 50 near a center region of the IC device 30. In other words, the edge regions have more PPI lines 50 on a per-unit-area basis than the center region. The distribution density of the conductive pads 40 may not be uniform throughout the IC device 30 either. In the example shown, the distribution density of the conductive pads 40 is lower around the edge regions of the IC device 30 compared to the center region. In other cases, the conductive pads may have other random and non-uniform distribution patterns. Such non-uniformity of the distribution of the contact pads 40 and the PPI lines 50 may lead to poor packaging reliability of the IC device 30. For example, the IC device may suffer from cracking or peeling issues, which would result in inadequate sealing of the IC device. The non-uniformity may also degrade electrical performance of the IC device. For example, the PPI line thickness variation will result in poor control of metal resistance or line-to-line metal capacitance.

Figure 2:
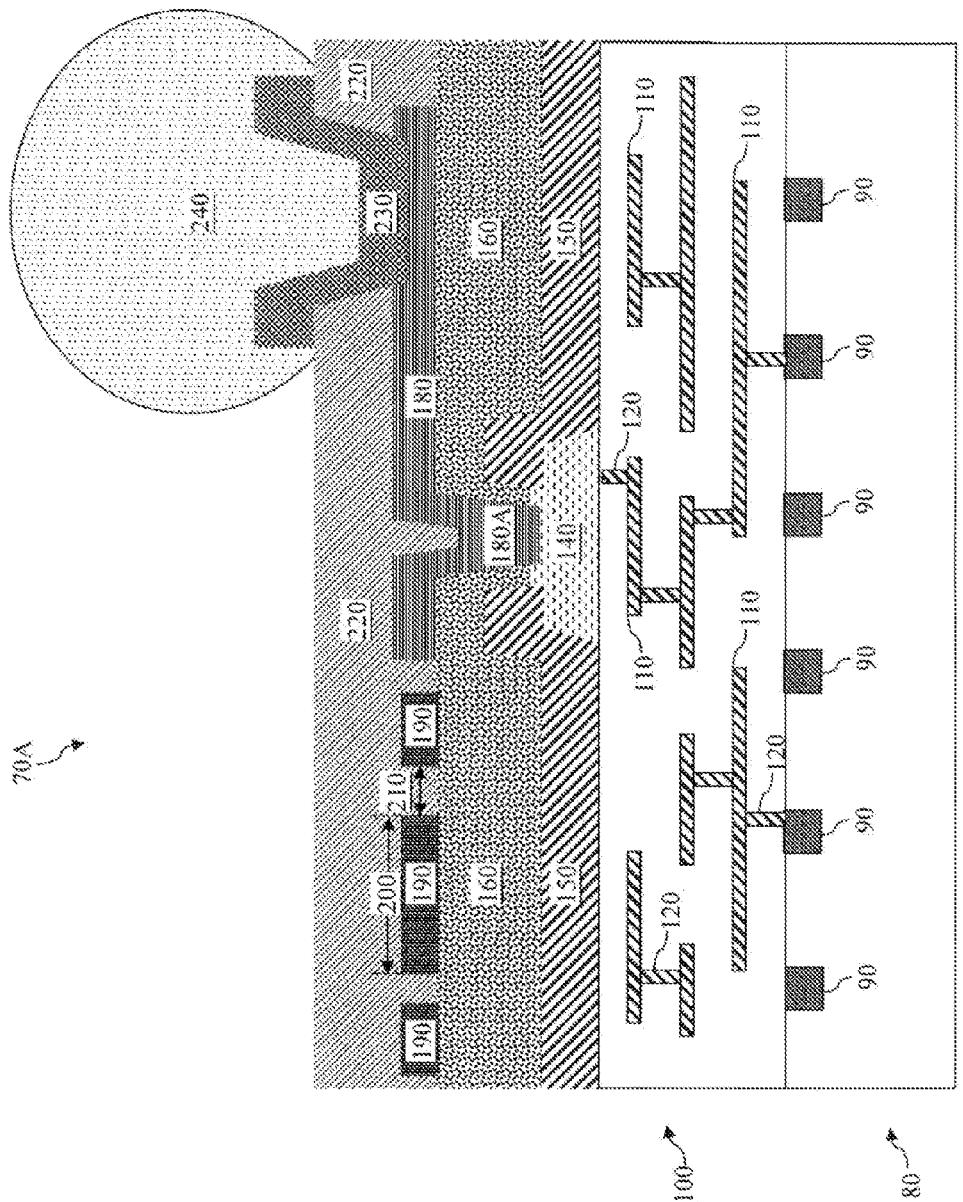
FIG. 2 is a diagrammatic fragmentary cross-sectional side view of a portion of an IC device according to an embodiment of the present disclosure.

Various aspects of the present disclosure offer uniformity improvements to overcome the packaging and electrical issues discussed above. FIG. 2 is a diagrammatic fragmentary cross-sectional side view of a portion of an IC device 70A according to an embodiment of the present disclosure. The IC device 70A includes a substrate 80 (also referred to as a wafer). The substrate 80 is a silicon substrate doped with a p-type dopant such as boron (for example a p-type substrate). Alternatively, the substrate 80 could be another suitable semiconductor material. For example, the substrate 80 may be a silicon substrate that is doped with an n-type dopant such as phosphorous or arsenic (an n-type substrate). The substrate 80 could include other elementary semiconductors such as germanium and diamond. The substrate 80 could optionally include a compound semiconductor and/or an alloy semiconductor. Further, the substrate 80 could include an epitaxial layer (epi layer), may be strained for performance enhancement, and may include a silicon-on-insulator (SOI) structure.

A plurality of electronic components 90 are formed in or on the substrate 80. These electronic components 90 may include active components such as Field Effect Transistors (FETs) or Bipolar Junction Transistors (BJTs), or passive components such as resistors, capacitors, or inductors. The IC device 70A may include millions or billions of these electronic components, but only a few are shown in FIG. 2 for the sake of simplicity.

An interconnect structure 100 is formed over the substrate 80. The interconnect structure 100 may also be considered a part of the substrate 80. The interconnect structure 100 includes a plurality of patterned dielectric layers and conductive layers that provide interconnections (e.g., wiring) between the various doped features, circuitry, and input/output of the IC device 70A. For example, the interconnect structure 100 includes an interlayer dielectric (ILD) and a multilayer interconnect (MLI) structure. The MLI structure includes contacts, vias and metal lines. For purposes of illustration, a plurality of conductive lines 110 (also referred to as metal lines or metal interconnects) and vias/contacts 120 are shown in FIG. 2, it being understood that the conductive lines 110 and vias/contacts 120 illustrated are merely exemplary, and the actual positioning and configuration of the conductive lines 110 and vias/contacts 120 may vary depending on design and manufacturing needs.

The MLI structure may contain conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 120) and horizontal connection (for example, conductive lines 110). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

A plurality of conductive pads 140 are formed over the interconnect structure 100. The conductive pads 140 include a metal material in the present embodiment, for example Aluminum (Al), but may include other conductive materials in alternative embodiments. The conductive pads 140 are each electrically coupled to at least one of the electronic components 90, so that electrical connections between the electronic components 90 and external devices may be established. The coupling may be done through one or more conductive lines 110 and one or more vias 120 in the interconnect structure 100. For the sake of simplicity, only one of such conductive pads 140 is shown in FIG. 2.

A passivation layer 150 is then formed over the interconnect structure 100 and over the conductive pads 140. The passivation layer 150 includes a silicon nitride or a silicon oxide material, or combinations thereof. The passivation layer 150 is formed by a process that may include chemical vapor deposition (CVD), physical vapor deposition (PVD), atomic layer deposition (ALD), combinations thereof, or another suitable process. The passivation layer 150 provides a sealing function for the various features and devices of the IC device 70A, so that they are less likely to be eroded or damaged by external components. For example, the passivation layer 150 prevents moisture, dust, and other contaminant particles from reaching inside the IC device 70A, which may degrade the performance of the IC device 70 and/or shorten its lifespan. In an embodiment, the passivation layer 150 has a thickness that is in a range from about 8 microns (um) to about 30 um.

A polymer layer 160 is formed over the passivation layer 150. The polymer layer 160 includes polymers of imide monomers, for example pyromellitic dianhydride monomers. Hence, the polymer layer 160 may also be referred to as a polyimide layer 160. In an embodiment, the polymer layer 160 has a thickness that is in a range from about 5 um to about 40 um. A plurality of trenches or openings may be formed in portions of the polymer layer 160 and the passivation layer 150 over the conductive pads 140, for example through a wet etching or a dry etching process. Thereafter, a plurality post-passivation interconnect (PPI) devices 180 may be formed over the polymer layer 160, portions 180A of which fill the respective trenches formed above the conductive pads 140. The portions 180A may be referred to as trench portions. The PPI devices 180 include a conductive material, for example copper (Cu), and may be formed by a suitable deposition process known in the art. For the sake of simplicity, only one such PPI device 180 is illustrated herein.

A plurality of dummy PPI devices 190 are also formed over the polymer layer 160. The dummy PPI devices 190 may be formed using the same process that forms the PPI device 180 and may be formed using the same mask. Hence, the dummy PPI devices 190 may have the same material composition as the PPI devices 180. Unlike the PPI devices 180, however, the dummy PPI devices 190 in the embodiment shown in FIG. 2 are not electrically coupled to any of the conductive pads 140, and thus are not electrically coupled to any of the electronic components 90. In other words, the dummy PPI devices 190 in this embodiment are isolated or stranded "standalone" devices.

The dummy PPI devices 190 may have any polygonal shape. In an embodiment, the dummy PPI devices 190 have lateral dimensions 200 (measured horizontally in the cross-sectional view of FIG. 2) that are each greater than or equal to about 10 um, and the dummy PPI devices 190 are spaced apart from adjacent dummy PPI devices 190 by respective distances 210 that are each greater than or equal to about 10 um. These dimensions will be discussed in more detail with reference to FIG. 4 below.

Still referring to FIG. 2, the presence of the dummy PPI devices 190 reduces the non-uniform distribution of the PPI devices 180. Stated differently, since the dummy PPI devices 190 and the PPI devices 180 contain substantially the same materials, they can be collectively considered a part of an overall PPI structure with respect to IC topography. In this manner, it is as if the PPI devices have been formed relatively uniformly throughout the IC device 70A. This is because although the functional PPI devices 180 have only been formed at selected areas of the IC device 70A, the dummy PPI devices 190 have been formed in other parts of the IC device 70A not occupied by the functional PPI devices 180.

As a result of the improved distribution density of the PPI devices, structural defects such as peeling or cracking may be reduced, and the electrical performance of the IC device 70A may be improved. In an embodiment, the overall PPI distribution density (the sum of the areas of the functional PPI devices 180 and the dummy PPI devices 190 divided by an overall area of the chip) is in a range from about 10% to about 70%.

After the PPI devices 180 and the dummy PPI devices 190 are formed, another polymer layer 220 is formed over the polymer layer 160, and over the PPI devices 180 and the dummy PPI devices 190. In an embodiment, the polymer layer 220 has a thickness that is in a range from about 5 um to about 40 um. The polymer layer 220 may include polymers of imide monomers as well. Alternatively, the polymer layer 220 may include a polymer material different from the material of the polymer layer 160. A plurality of trenches or openings are formed in portion of the polymer layer 220 overlying the PPI devices 180, and under-bump-metallization (UBM) devices 230 are formed to at least partially fill these openings. The UBM devices 230 may each include a plurality of metal layers to provide adequate adhesion to the conductive pads 180 therebelow and to provide protection for the underlying materials. The UBM devices 230 also provide wetting for conductive terminals to be formed above.

Still referring to FIG. 2, a plurality of conductive terminals 240 are formed on the UBM devices 230. In an embodiment, the conductive terminals 240 include solder balls or solder bumps, which may be formed by evaporation, electroplating, printing, jetting, stud bumping, or other suitable techniques. In an embodiment, the conductive terminals 240 include metal materials, for example, lead (Pb). The conductive terminals 240 allows external devices to be electrically coupled to (or gain electrical access to) the electronic components 90. In an embodiment, the conductive terminals 240 may be electrically coupled to IC packaging through a plurality of bonding wires (not illustrated herein). For the sake of simplicity, only one of the UBM devices 230 and one of the conductive terminals 240 are illustrated herein.

Figure 3:
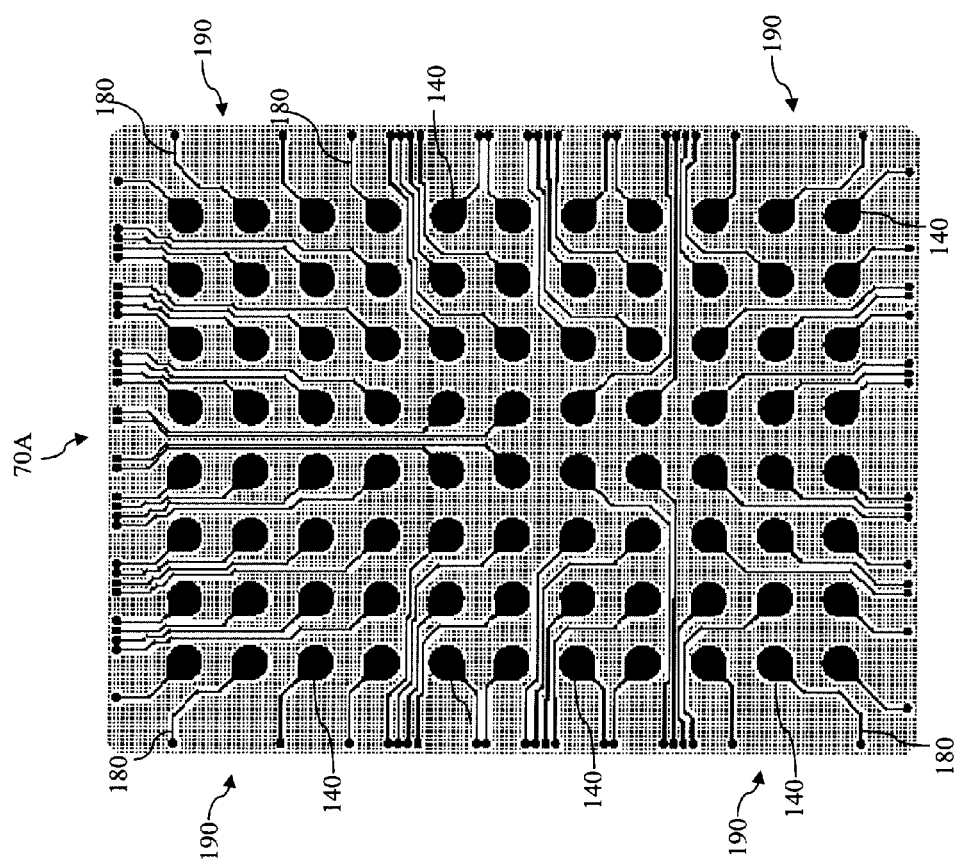
FIG. 3 is a simplified fragmentary top view of a portion of the IC device according to an embodiment of the present disclosure.

FIG. 3 is a simplified fragmentary top view of a portion of the IC device 70A. In this simplified top view, a plurality of conductive pads 140, a plurality of functional PPI devices 180, and a plurality of dummy PPI devices 190 are shown. In more detail, the conductive pads 140 are shown as relatively big and somewhat oval blocks, the functional PPI devices 180 are shown as elongated lines that are each coupled to a respective one of the conductive pads, and the dummy PPI devices 190 are shown as relatively small "dots" that are densely distributed throughout the IC device 70A. Without these dummy PPI devices 190, the distribution of the functional PPI devices 180 would have been uneven or non-uniform. For example, the distribution of the PPI devices 180 would have been higher near the edges of the IC device 70A than near the center. With the dummy PPI devices 190, the distribution of the PPI devices can become substantially uniform throughout the IC device 70A. Stated differently, the dummy PPI devices 190 help fill "voids" or empty spaces left by the functional PPI devices 180.

Figure 4:
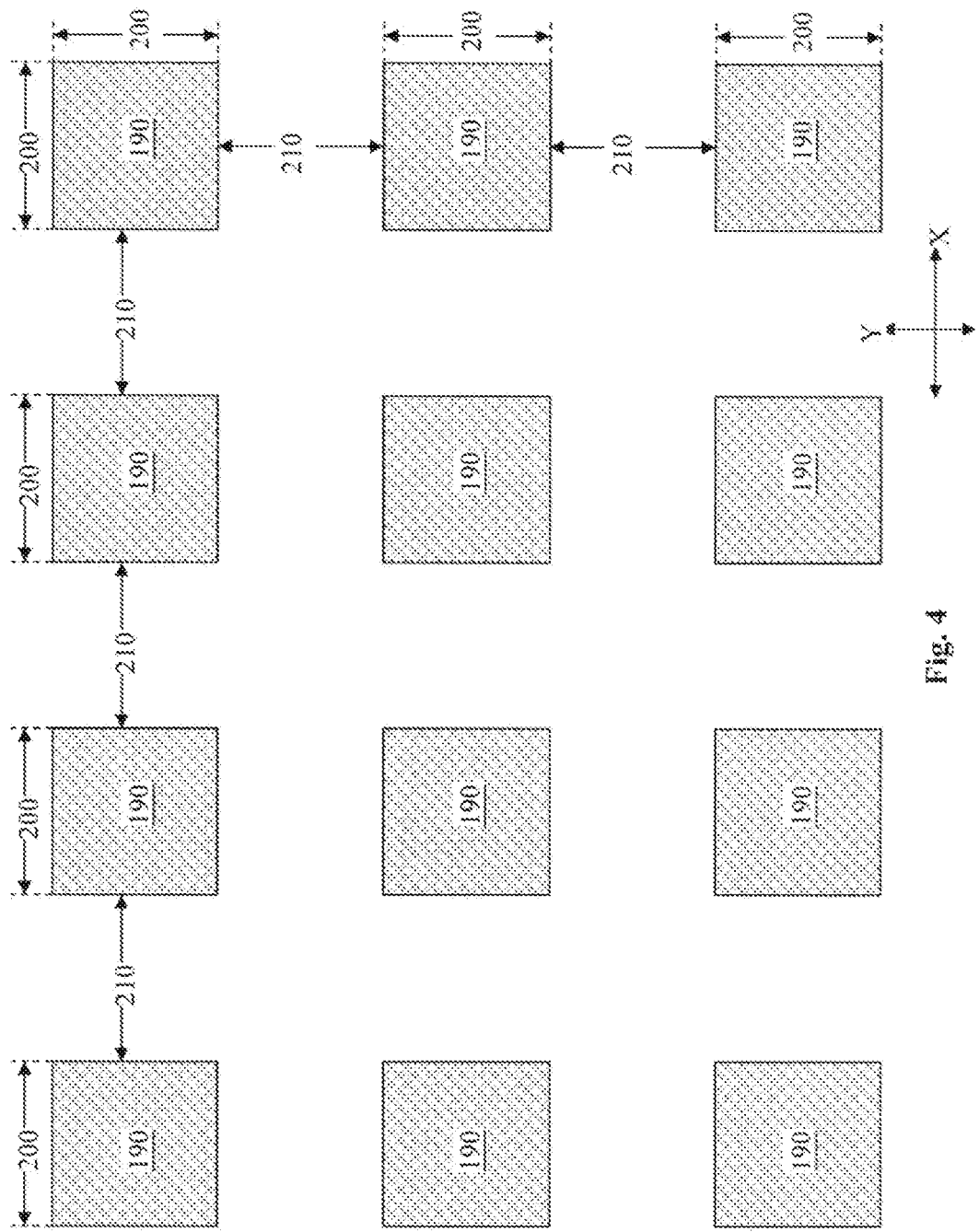
FIG. 4 is simplified top view of a portion of the IC device in more detail according to an embodiment of the present disclosure.

FIG. 4 is a simplified top view of a portion of the IC device 70A in more detail (zoomed in) according to one embodiment. It is understood that FIG. 4 only illustrates top views of a subset of the plurality of dummy PPI devices 190. The dummy PPI devices 190 in the illustrated embodiment have substantially rectangular or square shapes. As discussed above with reference to FIG. 2, the dummy PPI devices 190 have lateral dimensions 200 that are no less than about 10 um. The lateral dimensions 200 may be measured in either the X-direction or the Y-direction shown in the top view of FIG. 4. In addition, the dummy PPI devices 190 are spaced apart from adjacent dummy PPI devices by distances 210 that are no less than about 10 um. The distances 210 may be measured in either the X-direction or the Y-direction as well. In other embodiments, the lateral dimensions 200 and the distances 210 may be measured in other directions, for example in a direction that has an X-direction component as well as a Y-direction component. The distribution density of the dummy PPI devices 190 may be in a range from about 10% to about 70% in an embodiment. Also, it is understood that the dummy PPI devices 190 may assume a different polygonal shape in alternative embodiments.

As discussed above, the PPI devices 180 shown in FIGS. 2-3 are "functional" PPI devices, since they provide electrical coupling between the conductive terminals 240 (and therefore external devices) and the conductive pads 140 (and therefore the electronic components 90). In comparison, the dummy PPI devices 190 shown in FIGS. 2-4 are dummy devices because they do not provide electrical coupling between the conductive terminals 240 and the electronic components 90. The dummy PPI devices 190 are formed to improve the distribution density uniformity of the PPI devices 180 over the IC device 70A, so that the topography of the IC device 70A is more balanced.

Figure 5:
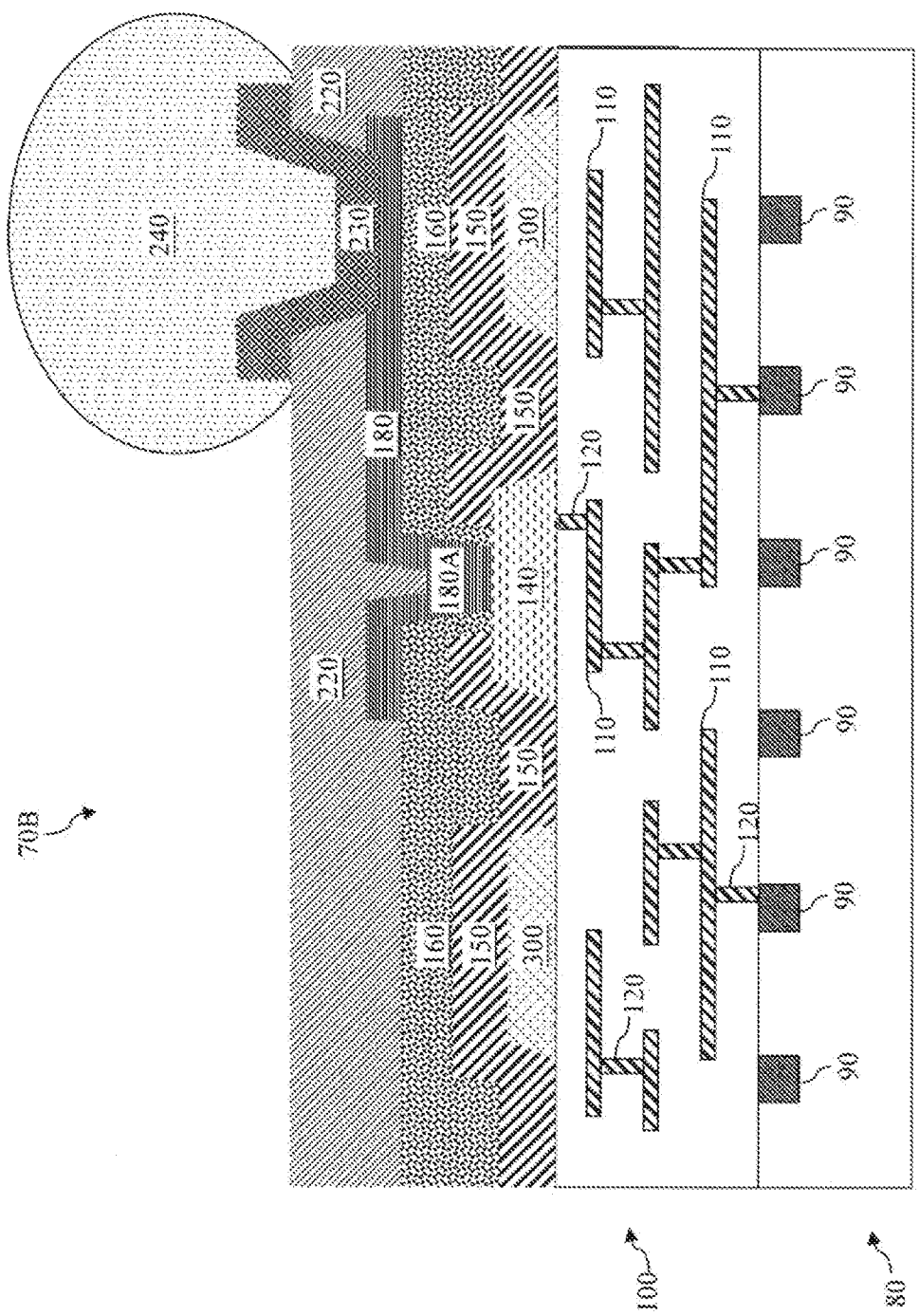
FIGS. 5-7 are respective diagrammatic fragmentary cross-sectional side views of a portion of an IC device according to various embodiments of the present disclosure.

FIG. 5 is a diagrammatic fragmentary cross-sectional side view of a portion of an IC device 70B according to an alternative embodiment of the present disclosure. The IC device 70B is similar to the IC device 70A of FIG. 2, and as such, similar components appearing in both FIGS. 2 and 5 will be labeled the same for the sake of clarity and consistency. Referring to FIG. 5, the IC device 70B includes a substrate or wafer 80 in which electronic components 90 are formed. An interconnect structure 100 is formed over the substrate 80 to provide electrical coupling to the electronic components 90. A plurality of conductive pads 140 are formed over the interconnect structure 100. These conductive pads 140 are considered "functional" conductive pads because they are electrically coupled to the electronic components 90 through vias/contacts 120 and conductive lines 110 of the interconnect structure 100. In other words, the conductive pads 140 provide electrical input/output to the electronic components 90.

In the alternative embodiment illustrated in FIG. 5, a plurality of dummy conductive pads 300 is also formed. In an embodiment, the dummy conductive pads 300 contain substantially identical materials as the conductive pads 140 and may be formed using the same processes that form the conductive pads 140. The dummy conductive pads 300 are considered to be "dummy" pads because they are not necessarily electrically coupled to any of the electronic components 90. Instead, the dummy conductive pads 300 serve a purpose similar to the dummy PPI devices 190 of FIG. 2—to help improve the distribution uniformity of the conductive pads 140.

In more detail, recall from the discussions above with reference to FIG. 1, the distribution density of the functional conductive pads 140 may not be uniform throughout an IC device. Similar to the PPI devices, this lack of uniformity of the conductive pads may also result in peeling, cracking, and other performance degradation issues. Here, the dummy conductive pads 300 have substantially similar material compositions as the conductive pads 140 and may therefore be considered the same as the conductive pads 140 from a distribution density and/or topography perspective. In this manner, the dummy conductive pads 300 are formed to improve the distribution uniformity of the conductive pads 140 on the IC device 70B, so that a more uniform topography may be achieved.

After the dummy conductive pads 300 are formed, processes discussed above with reference to FIG. 2 are used to form the passivation layer 150, the PPI devices 180, the polymer layers 160 and 220, the UBMs 230, and the conductive terminals 240. The PPI devices 180 are electrically coupled to the respective conductive pads 140 and the respective conductive terminals 240. The PPI devices 180 are not electrically coupled to any of the dummy conductive pads 300 in the embodiment shown. Also, no dummy PPI devices are formed according to the embodiment shown. Thus, in this embodiment, the dummy conductive pads 300 are covered by the passivation layer 150 and are electrically isolated from other devices.

Figure 6:
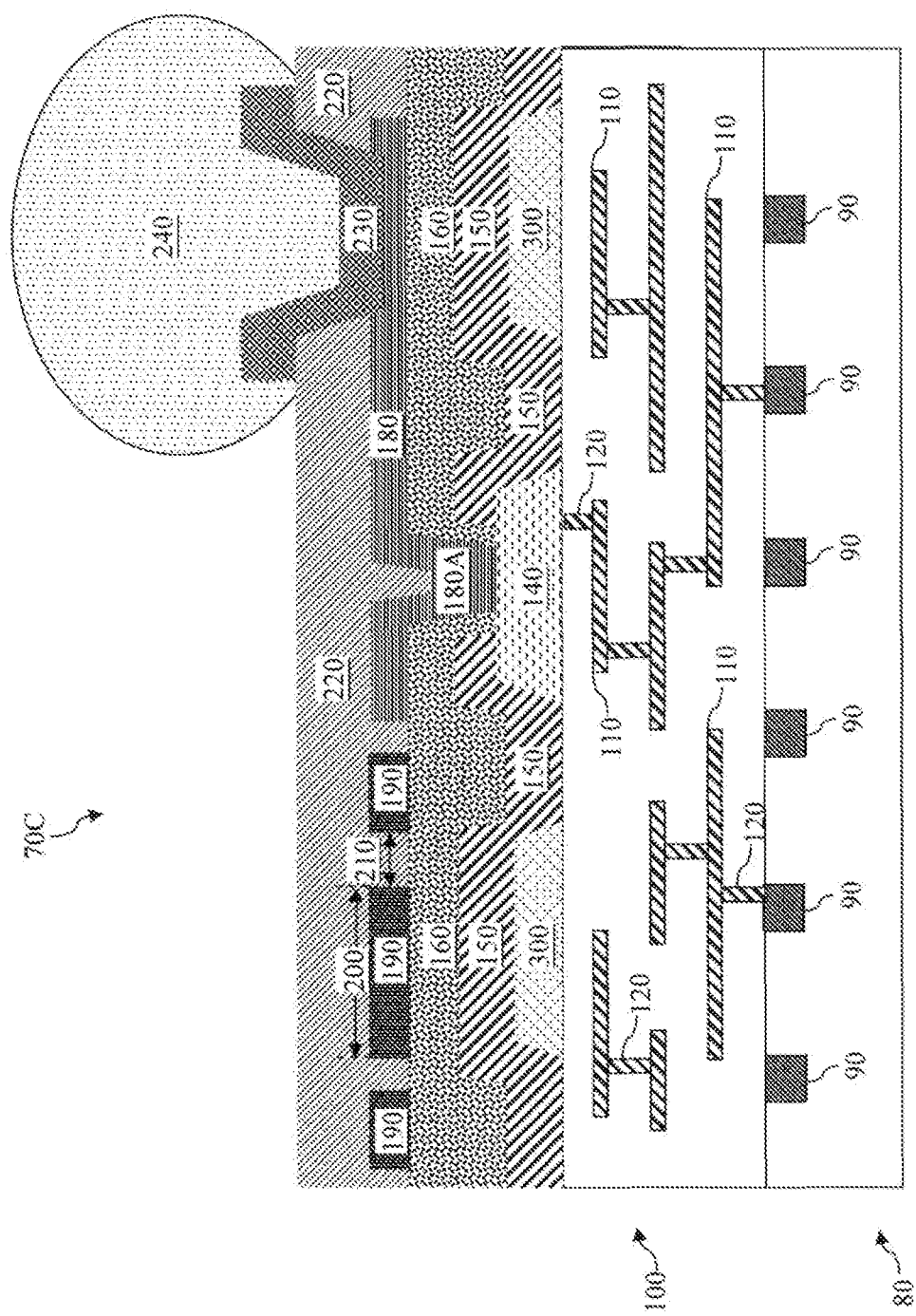

FIG. 6 is a diagrammatic fragmentary cross-sectional side view of a portion of an IC device 70C according to another alternative embodiment of the present disclosure. The IC device 70C is similar to the IC devices 70A and 70B of FIGS. 2 and 5, and as such, similar components appearing in all of FIGS. 2, 5, and 6 will be labeled the same for the sake of clarity and consistency. Referring to FIG. 6, the IC device 70C includes a substrate or wafer 80 in which electronic components 90 are formed. An interconnect structure 100 is formed over the substrate 80 to provide electrical coupling to the electronic components 90. A plurality of functional conductive pads 140 as well as a plurality of dummy conductive pads 300 are formed over the interconnect structure 100. The functional conductive pads 140 provide electrical input/output to the electronic components 90, while the dummy conductive pads 300 help improve the distribution density uniformity of the conductive pads 140.

A passivation layer 150 is formed over the conductive pads 140 and the dummy conductive pads 300. A polymer layer 160 is formed over the passivation layer 150. Trenches are formed over the conductive pads 140 and are filled with PPI devices 180, which are formed over the polymer layer 160. In the embodiment shown in FIG. 6, dummy PPI devices 190 are also formed to help improve the distribution density uniformity of the PPI devices 180. Thereafter, a polymer layer 220 is formed over the PPI devices 180 and the dummy PPI devices 190, and the UBMs 230 and the conductive terminals 240 are formed to provide electrical connections to the conductive pads 140 and the electronic components 90 in the substrate 80. Based on the discussions above, the embodiment shown in FIG. 6 may be considered a combination of the embodiment shown in FIG. 2 and the embodiment shown in FIG. 5.

Figure 7:
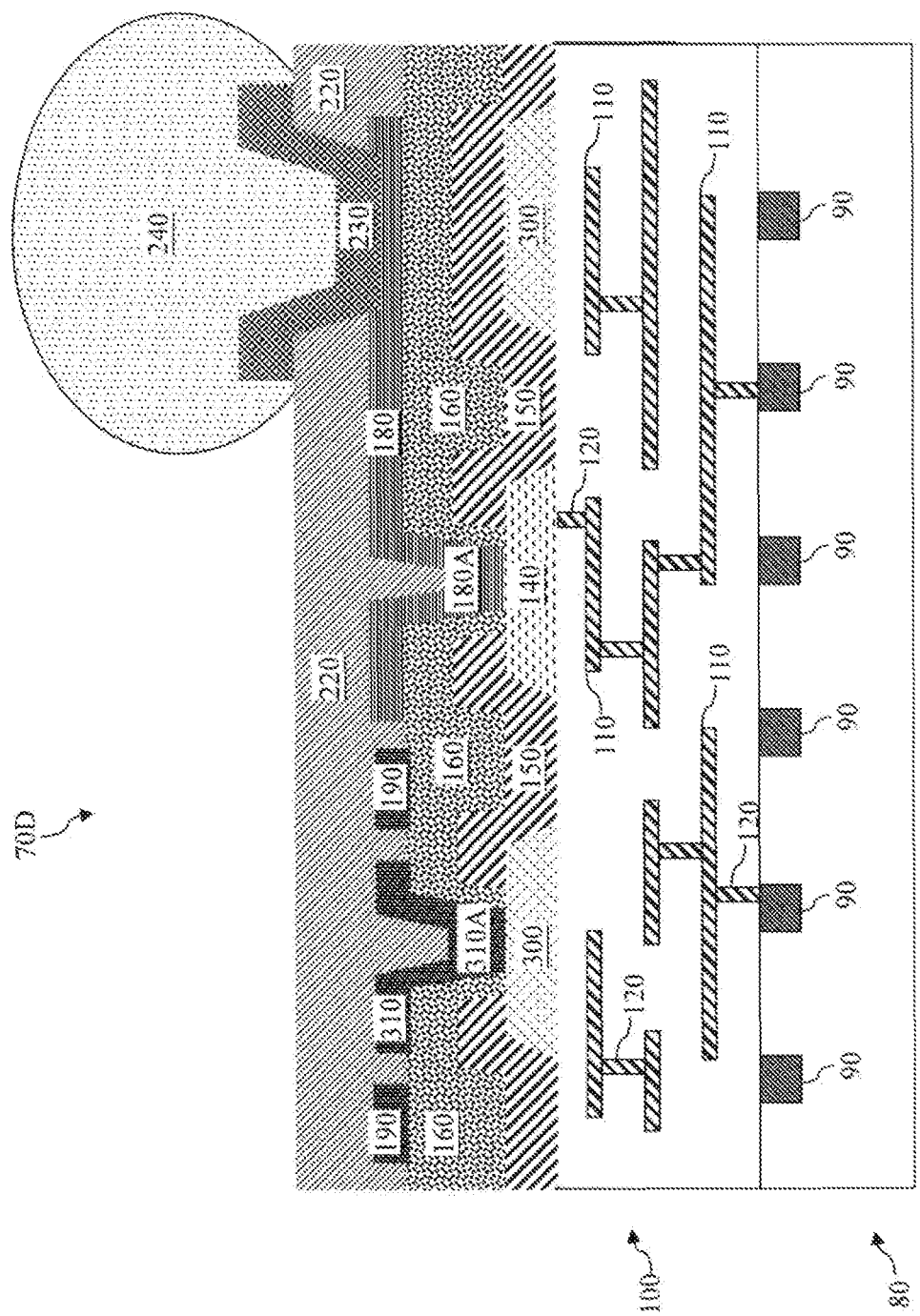

FIG. 7 is a diagrammatic fragmentary cross-sectional side view of a portion of an IC device 70D according to one more alternative embodiment of the present disclosure. The IC device 70D is similar to the IC devices 70A-70C discussed above with reference to FIGS. 2, 5 and 6. As such, similar components appearing in all of FIGS. 2, 5, 6, and 7 will be labeled the same for the sake of clarity and consistency. Referring to FIG. 7, the IC device 70D includes a substrate or wafer 80 in which electronic components 90 are formed. An interconnect structure 100 is formed over the substrate 80 to provide electrical coupling to the electronic components 90. A plurality of functional conductive pads 140 as well as a plurality of dummy conductive pads 300 are formed over the interconnect structure 100. The functional conductive pads 140 provide electrical input/output to the electronic components 90, while the dummy conductive pads 300 help improve the distribution density uniformity of the conductive pads 140.

A passivation layer 150 is formed over the conductive pads 140 and the dummy conductive pads 300. A polymer layer 160 is formed over the passivation layer. Trenches or openings are formed in the polymer layer 160 and the passivation layer 150 above the conductive pads 140 and the dummy pads 300. PPI devices 180 and dummy PPI devices 190 and 310 are formed over the polymer layer 160. Portions 310A of the dummy PPI devices 310A at least partially fill the trenches formed above the dummy conductive pads 300 and may thus be referred to as dummy trench portions. Thereafter, a polymer layer 220 is formed over the PPI devices 180 and the dummy PPI devices 190 and 310, and the UBMs 230 and the conductive terminals 240 are formed to provide electrical connections to the conductive pads 140 and the electronic components 90 in the substrate 80.

In the embodiment shown in FIG. 7, the dummy trench portions 310A help improve the distribution density of the trench portions 180A of the functional PPI devices. The dummy PPI devices 310, the dummy trench portions 310A, and the dummy conductive pads 300 may be collectively referred to as dummy pillar structures. The dummy pillar structures also help reinforce the adhesion between the passivation layer 150 and the polymer layers 160 and/or 220.

FIG. 8 is a flowchart illustrating a method 400 for carrying out the processes used to form the IC devices 70A-70D discussed above. The method 400 includes a block 410, in which a plurality of functional conductive pads and a plurality of dummy conductive pads are formed over a wafer. The wafer contains an interconnect structure. The functional conductive pads and the dummy conductive pads are formed over the interconnect structure. The method 400 includes a block 420, in which a passivation layer is formed over the functional conductive pads and the dummy conductive pads. The passivation layer at least partially seals the functional conductive pads and the dummy conductive pads. The method 400 includes a block 430, in which a plurality of conductive terminals is formed over the passivation layer. The conductive terminals are each electrically coupled to at least one of the functional conductive pads. The conductive terminals are not electrically coupled to any of the dummy conductive pads.

The various embodiments of the present disclosure discussed above offer advantage over conventional devices, it being understood that no particular advantage is required for all embodiments, and that different embodiments may offer different advantages. One of the advantages is that the distribution density may be improved (more uniform) for the conductive pads, the PPI devices, and the trenches coupling the conductive pads and the PPI devices. The improvement of the distribution density is at least partially due to the use of dummy conductive pads, dummy PPI devices, and dummy trenches. The improved distribution uniformity may lead to less peeling or cracking issues, and may enhance electrical performance of the IC device. Also, these dummy structures need not be electrically coupled to electronic components inside or outside the IC device and therefore will not interfere with the intended electrical operation of the IC device. Another advantage is that the formation of the various dummy devices discussed above require no extra fabrication processes, as they can be formed using the same fabrication processes that form the functional conductive pads and the PPI devices.

One of the broader forms of the present disclosure involves a semiconductor device. The semiconductor device includes: a wafer containing an interconnect structure, the interconnect structure including a plurality of vias and interconnect lines; a first conductive pad disposed over the interconnect structure, the first conductive pad being electrically coupled to the interconnect structure; a plurality of second conductive pads disposed over the interconnect structure; a passivation layer disposed over and at least partially sealing the first and second conductive pads; and a conductive terminal that is electrically coupled to the first conductive pad but is not electrically coupled to the second conductive pads.

Another one of the broader forms of the present disclosure involves a semiconductor device. The semiconductor device includes a plurality of functional conductive pads and a plurality of dummy conductive pads formed over a substrate; a passivation layer formed over the functional conductive pads and the dummy conductive pads, the passivation layer at least partially sealing the functional conductive pads and the dummy conductive pads; a plurality of functional post-passivation interconnect (PPI) devices formed over the passivation layer, wherein each functional PPI devices is electrically coupled to a respective one of the functional conductive pads; a plurality of dummy PPI devices formed over the passivation layer, wherein the dummy PPI devices are free of electrical coupling to the functional conductive pads; a polymer layer formed over the functional PPI devices and the dummy PPI devices; and a plurality of conductive terminals formed over the polymer layer, wherein each of the conductive terminals is electrically coupled to at least one of the functional PPI devices, but the conductive terminals are free of electrical coupling to the dummy PPI devices.

Yet one more of the broader forms of the present disclosure involves a method of fabricating a semiconductor device. The method includes: forming a plurality of functional conductive pads and a plurality of dummy conductive pads over a wafer that contains an interconnect structure, wherein the functional conductive pads and the dummy conductive pads are formed over the interconnect structure; forming a passivation layer over the functional conductive pads and the dummy conductive pads, the passivation layer at least partially sealing the functional conductive pads and the dummy conductive pads; and forming a plurality of conductive terminals over the passivation layer, the conductive terminals each being electrically coupled to at least one of the functional conductive pads but being free of electrical coupling to the dummy conductive pads.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a wafer containing an interconnect structure, the interconnect structure including a plurality of vias and interconnect lines;
a first conductive pad disposed over the interconnect structure, the first conductive pad being electrically coupled to the interconnect structure;
a plurality of second conductive pads disposed over the interconnect structure;
passivation layer disposed over and at least partially sealing the first and second conductive pads;
a conductive terminal that is electrically coupled to the first conductive pad but is not electrically coupled to the second conductive pads; and
a first post-passivation interconnect (PPI) device disposed over the passivation layer, wherein the first PPI device is electrically coupled to the first conductive pad, and wherein the first PPI device is electrically coupled to the conductive terminal.

2. The semiconductor device of claim 1, wherein:
the wafer contains a plurality of electronic components;
the first conductive pad is electrically coupled to at least one of the electronic components through the interconnect structure; and
the second conductive pads are not electrically coupled to the electronic components.

3. The semiconductor device of claim 1, further including:
a plurality of second PPI devices disposed over the passivation layer, wherein none of the second PPI devices are electrically coupled to the first conductive pad, and wherein none of the second PPI devices are electrically coupled to the conductive terminal.

4. The semiconductor device of claim 3, wherein the conductive terminal includes a solder ball.

5. The semiconductor device of claim 3. wherein the first and second conductive pads have the same material composition, and wherein the first and second PPI devices have the same material composition.

6. The semiconductor device, of claim 3, wherein:
the second PPI devices each have a polygonal shape;
the second PPI devices each have a dimension that is no less than about 10 microns; and
each second PPI device is spaced apart from adjacent second PPI devices by a distance that is no less than about 10 microns.

7. The semieonductor device of claim 3, wherein:
the first PPI device includes a trench portion that is in direct contact with the first conductive pad; and
at least a subset of the second PPI devices include respective trench portions that are in direct contact with the respective second conductive pads.

8. The semiconductor device of claim. 3, further including:
a first polymer layer that is disposed. between the passivation layer and the first and second. PPI devices; and
a second polymer layer that is disposed over the first and second PPI devices.

9. A semiconductor device, comprising:
a plurality of functional conductive pads and a plurality of dummy conductive, pads formed over a substrate;
a passivation layer formed over the functional conductive pads and the dummy conductive pads, the passivation layer at least partially sealing the functional conductive pads and the dummy conductive pads;
a plurality of functional post-passivation interconnect (PPI) devices formed over the passivation layer, wherein each functional PPI devices is electrically coupled to a respective one of the functional conductive pads;
a plurality of dummy PPI devices formed over the passivation layer, wherein the dummy PPI devices are free of electrical coupling to the functional conductive pads;
a polymer layer fanned over the functional PPI devices and the dummy PPI devices; and
a plurality of conductive terminals formed over the polymer layer, wherein each of the conductive terminals is electrically coupled to at least one of the functional PPI devices, but the conductive terminals are free of electrical coupling to the dummy PPI devices.

10. The semiconductor device of claim 9, wherein:
the substrate includes a plurality of electronic components formed therein and an interconnect structure formed over the electronic components;
the functional conductive pads are each electrically coupled to at least one of the electronic components; and
the dummy conductive pads are free of electrical coupling to the electronic components.

11. The semiconductor device of claim 9, further including:
a plurality of functional conductive trenches that are each electrically coupled to a respective one of the functional PPI devices and a respective one of the functional conductive pads; and a plurality of dummy conductive, trenches that are each electrically coupled to a respective one of the dummy PPI devices and a respective one of the dummy conductive pads.

12. The semiconductor device of claim 9, wherein:
the conductive terminals each include a solder ball;
the functional conductive pads and the dummy conductive pads include substantially identical material compositions; and
the functional PPI devices and the dummy PPI devices include substantially identical material compositions.

13. The semiconductor device of claim 9, wherein:
the dummy PPI devices each have a polygonal shape;
the dummy PPI devices each have a dimension that is greater than about 10 microns: and
each dummy PPI device is spaced apart from adjacent dummy PPI devices by a distance that is greater than about 10 microns.

14. A method, comprising:
forming a plurality of functional conductive pads and a plurality of dummy conductive pads over a wafer that contains an interconnect structure, wherein the functional conductive pads and the dummy conductive pads are formed over the interconnect structure;
forming a passivation layer over the functional conductive pads and the dummy conductive pads, the passivation layer at least partially sealing the functional conductive pads and the dummy conductive pads; and
forming a plurality of conductive terminals over the passivation layer, the conductive, terminals each being electrically coupled to at least one of the functional conductive pads but being free of electrical coupling to the dummy conductive pads; and
forming a plurality of functional post-passivation interconnect (PPI) devices, wherein the functional PPI devices are each electrically coupled to a respective one of the conductive terminals.

15. The method of claim 14, wherein:
the wafer contains a plurality of electronic components; and
the forming the functional conductive pads and the dummy conductive pads is carried out in a manner so that the functional conductive pads are each electrically coupled to at least one of the electronic components through the interconnect structure, and the dummy conductive pads are free of eletrical coupling to the electronic components, 16. The method of claim 14, further including, before the forming the conductive terminals:
forming plurality of dummy PPI devices over the passivation layer, wherein the dummy PPI devices are free of electrical coupling to the conductive terminals.

17. The method of claim 16, wherein:
the forming the functional PPI devices and the dummy PPI devices is carried out in a manner so that:
the functional PPI devices are each electrically coupled to a respective one of the functional conductive pads; and
the dummy PPI devices are free of electrical coupling to the functional conductive pads, 18. The method of claim 16, wherein:
the conductive terminal includes a solder ball;
the functional conductive pads and the dummy conductive pads have substantially identical material compositions; and
the functional PPI devices and the dummy PPI devices have substantially identical material compositions.

19. The method of claim 16, wherein the forming the dummy PPI devices, is carried out in a manner so that:
the dummy PPI devices each have a polygonal shape;
the dummy PPI devices each have a dimension that is no less than about 10 microns: and
each dummy PPI device is spaced apart from adjacent dummy PPI devices by a distance that is no less than about 10 microns.

20. The method of claim 16, wherein the forming the dummy PPI devices is carried out in a manner so that:
at least a subset of the dummy PPI devices include respective dummy trench portions that are in direct contact with the respective dummy conductive pads.

* * * * *